US012695410B2

(12) United States Patent (10) Patent No.: US 12,695,410 B2
Dohner et al. (45) Date of Patent: Jul. 28, 2026

(54) FRONTSHEETS FOR PHOTOVOLTAIC MODULES

(71) Applicant: GAF Energy LLC, Parsippany, NJ (US)

(72) Inventors: Emma Dohner, Menlo Park, CA (US); William Sirski, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 19/198,682

(22) Filed: May 5, 2025

(65) Prior Publication Data

US 2025/0343500 A1     Nov. 6, 2025

Related U.S. Application Data

(60) Provisional application No. 63/643,002, filed on May 6, 2024.

(51) Int. Cl.
H02S 20/23 (2014.01)
H10F 19/80 (2025.01)

(52) U.S. Cl.
CPC ........... H02S 20/23 (2014.12); H10F 19/804 (2025.01)

(58) Field of Classification Search
CPC ...... H10F 19/80; H10F 19/804; H10F 77/311; H10F 77/315; H10F 77/413; H02S 40/20; H02S 40/22; H02S 30/00
See application file for complete search history.

(56) References Cited

U.S. PATENT DOCUMENTS

| | | | |
|---|---|---|---|
| 1,981,467 A | 11/1934 | Radtke | |
| 3,156,497 A | 11/1964 | Lessard | |
| 3,581,779 A | 6/1971 | Gilbert, Jr. | |
| 4,258,948 A | 3/1981 | Hoffmann | |
| 4,349,220 A | 9/1982 | Carroll et al. | |
| 4,499,702 A | 2/1985 | Turner | |
| 4,636,577 A | 1/1987 | Peterpaul | |
| 5,167,579 A | 12/1992 | Rotter | |
| 5,437,735 A | 8/1995 | Younan et al. | |
| 5,590,495 A | 1/1997 | Bressler et al. | |
| 5,642,596 A | 7/1997 | Waddington | |

(Continued)

FOREIGN PATENT DOCUMENTS

| | | | |
|---|---|---|---|
| CA | 2829440 A | 5/2019 | |
| CA | 3085698 A1 * | 1/2022 | ............. H10F 19/80 |

(Continued)

OTHER PUBLICATIONS

English machine translation of Lin et al. (CN 116376452) published Jul. 4, 2023.*

(Continued)

*Primary Examiner* — Christina Chern

(74) *Attorney, Agent, or Firm* — GREENBERG TRAURIG, LLP

(57) ABSTRACT

A roofing system, including a roof deck and a plurality of photovoltaic modules installed on the roof deck. Each of the plurality of photovoltaic modules includes at least one solar cell, an encapsulant encapsulating the at least one solar cell, and a frontsheet above the encapsulant. The frontsheet includes a first layer, where the first layer contacts the roof deck, and where the first layer comprises a plurality of cavities or a plurality of ribs.

18 Claims, 4 Drawing Sheets

(56) References Cited

U.S. PATENT DOCUMENTS

| | | | |
|---|---|---|---|
| 6,008,450 | A | 12/1999 | Ohtsuka et al. |
| 6,033,270 | A | 3/2000 | Stuart |
| 6,046,399 | A | 4/2000 | Kapner |
| 6,201,180 | B1 | 3/2001 | Meyer et al. |
| 6,220,329 | B1 | 4/2001 | King et al. |
| 6,308,482 | B1 | 10/2001 | Strait |
| 6,320,114 | B1 | 11/2001 | Kuechler |
| 6,320,115 | B1 | 11/2001 | Kataoka et al. |
| 6,336,304 | B1 | 1/2002 | Mimura et al. |
| 6,341,454 | B1 | 1/2002 | Koleoglou |
| 6,407,329 | B1 | 6/2002 | Iino et al. |
| 6,576,830 | B2 | 6/2003 | Nagao et al. |
| 6,928,781 | B2 | 8/2005 | Desbois et al. |
| 6,972,367 | B2 | 12/2005 | Federspiel et al. |
| 7,138,578 | B2 | 11/2006 | Komamine |
| 7,155,870 | B2 | 1/2007 | Almy |
| 7,178,295 | B2 | 2/2007 | Dinwoodie |
| 7,487,771 | B1 | 2/2009 | Eiffert et al. |
| 7,587,864 | B2 | 9/2009 | McCaskill et al. |
| 7,678,990 | B2 | 3/2010 | McCaskill et al. |
| 7,678,991 | B2 | 3/2010 | McCaskill et al. |
| 7,748,191 | B2 | 7/2010 | Podirsky |
| 7,819,114 | B2 | 10/2010 | Augenbraun et al. |
| 7,824,191 | B1 | 11/2010 | Podirsky |
| 7,832,176 | B2 | 11/2010 | McCaskill et al. |
| 8,118,109 | B1 | 2/2012 | Hacker |
| 8,168,880 | B2 | 5/2012 | Jacobs et al. |
| 8,173,889 | B2 | 5/2012 | Kalkanoglu et al. |
| 8,210,570 | B1 | 7/2012 | Railkar et al. |
| 8,276,329 | B2 | 10/2012 | Lenox |
| 8,312,693 | B2 | 11/2012 | Cappelli |
| 8,319,093 | B2 | 11/2012 | Kalkanoglu et al. |
| 8,333,040 | B2 | 12/2012 | Shiao et al. |
| 8,371,076 | B2 | 2/2013 | Jones et al. |
| 8,375,653 | B2 | 2/2013 | Shiao et al. |
| 8,404,967 | B2 | 3/2013 | Kalkanoglu et al. |
| 8,410,349 | B2 | 4/2013 | Kalkanoglu et al. |
| 8,418,415 | B2 | 4/2013 | Shiao et al. |
| 8,438,796 | B2 | 5/2013 | Shiao et al. |
| 8,468,754 | B2 | 6/2013 | Railkar et al. |
| 8,468,757 | B2 | 6/2013 | Krause et al. |
| 8,505,249 | B2 | 8/2013 | Geary |
| 8,512,866 | B2 | 8/2013 | Taylor |
| 8,513,517 | B2 | 8/2013 | Kalkanoglu et al. |
| 8,586,856 | B2 | 11/2013 | Kalkanoglu et al. |
| 8,601,754 | B2 | 12/2013 | Jenkins et al. |
| 8,629,578 | B2 | 1/2014 | Kurs et al. |
| 8,646,228 | B2 | 2/2014 | Jenkins |
| 8,656,657 | B2 | 2/2014 | Livsey et al. |
| 8,671,630 | B2 | 3/2014 | Lena et al. |
| 8,677,702 | B2 | 3/2014 | Jenkins |
| 8,695,289 | B2 | 4/2014 | Koch et al. |
| 8,713,858 | B1 | 5/2014 | Xie |
| 8,713,860 | B2 | 5/2014 | Railkar et al. |
| 8,733,038 | B2 | 5/2014 | Kalkanoglu et al. |
| 8,776,455 | B2 | 7/2014 | Azoulay |
| 8,789,321 | B2 | 7/2014 | Ishida |
| 8,793,940 | B2 | 8/2014 | Kalkanoglu et al. |
| 8,793,941 | B2 | 8/2014 | Bosler et al. |
| 8,826,607 | B2 | 9/2014 | Shiao et al. |
| 8,835,751 | B2 | 9/2014 | Kalkanoglu et al. |
| 8,863,451 | B2 | 10/2014 | Jenkins et al. |
| 8,898,970 | B2 | 12/2014 | Jenkins et al. |
| 8,925,262 | B2 | 1/2015 | Railkar et al. |
| 8,943,766 | B2 | 2/2015 | Gombarick et al. |
| 8,946,544 | B2 | 2/2015 | Jabos et al. |
| 8,950,128 | B2 | 2/2015 | Kalkanoglu et al. |
| 8,959,848 | B2 | 2/2015 | Jenkins et al. |
| 8,966,838 | B2 | 3/2015 | Jenkins |
| 8,966,850 | B2 | 3/2015 | Jenkins et al. |
| 8,994,224 | B2 | 3/2015 | Mehta et al. |
| 9,032,672 | B2 | 5/2015 | Livsey et al. |
| 9,121,178 | B2 | 9/2015 | Belt et al. |
| 9,153,950 | B2 | 10/2015 | Yamanaka et al. |
| 9,166,087 | B2 | 10/2015 | Chihlas et al. |
| 9,169,646 | B2 | 10/2015 | Rodrigues et al. |
| 9,170,034 | B2 | 10/2015 | Bosler et al. |
| 9,178,465 | B2 | 11/2015 | Shiao et al. |
| 9,202,955 | B2 | 12/2015 | Livsey et al. |
| 9,212,832 | B2 | 12/2015 | Jenkins |
| 9,217,584 | B2 | 12/2015 | Kalkanoglu et al. |
| 9,270,221 | B2 | 2/2016 | Zhao |
| 9,273,885 | B2 | 3/2016 | Rodrigues et al. |
| 9,276,141 | B2 | 3/2016 | Kalkanoglu et al. |
| 9,331,224 | B2 | 5/2016 | Koch et al. |
| 9,356,174 | B2 | 5/2016 | Duarte et al. |
| 9,359,014 | B1 | 6/2016 | Yang et al. |
| 9,412,890 | B1 | 8/2016 | Meyers |
| 9,528,270 | B2 | 12/2016 | Jenkins et al. |
| 9,605,432 | B1 | 3/2017 | Robbins |
| 9,711,672 | B2 | 7/2017 | Wang |
| 9,755,573 | B2 | 9/2017 | Livsey et al. |
| 9,786,802 | B2 | 10/2017 | Shiao et al. |
| 9,831,818 | B2 | 11/2017 | West |
| 9,912,284 | B2 | 3/2018 | Svec |
| 9,923,515 | B2 | 3/2018 | Rodrigues et al. |
| 9,938,729 | B2 | 4/2018 | Coon |
| 9,991,412 | B2 | 6/2018 | Gonzalez et al. |
| 9,998,067 | B2 | 6/2018 | Kalkanoglu et al. |
| 10,027,273 | B2 | 7/2018 | West et al. |
| 10,115,850 | B2 | 10/2018 | Rodrigues et al. |
| 10,128,660 | B1 | 11/2018 | Apte et al. |
| 10,156,075 | B1 | 12/2018 | McDonough |
| 10,187,005 | B2 | 1/2019 | Rodrigues et al. |
| 10,256,765 | B2 | 4/2019 | Rodrigues et al. |
| 10,284,136 | B1 | 5/2019 | Mayfield et al. |
| 10,454,408 | B2 | 10/2019 | Livsey et al. |
| 10,530,292 | B1 | 1/2020 | Cropper et al. |
| 10,560,048 | B2 | 2/2020 | Fisher et al. |
| 10,563,406 | B2 | 2/2020 | Kalkanoglu et al. |
| D879,031 | S | 3/2020 | Lance et al. |
| 10,579,028 | B1 | 3/2020 | Jacob |
| 10,784,813 | B2 | 9/2020 | Kalkanoglu et al. |
| D904,289 | S | 12/2020 | Lance et al. |
| 11,012,026 | B2 | 5/2021 | Kalkanoglu et al. |
| 11,085,187 | B2 | 8/2021 | Grubka et al. |
| 11,177,639 | B1 | 11/2021 | Nguyen et al. |
| 11,217,715 | B2 | 1/2022 | Sharenko et al. |
| 11,251,744 | B1 | 2/2022 | Bunea et al. |
| 11,258,399 | B2 | 2/2022 | Kalkanoglu et al. |
| 11,283,394 | B2 | 3/2022 | Perkins et al. |
| 11,309,828 | B2 | 4/2022 | Sirski et al. |
| 11,394,344 | B2 | 7/2022 | Perkins et al. |
| 11,424,379 | B2 | 8/2022 | Sharenko et al. |
| 11,431,280 | B2 | 8/2022 | Liu et al. |
| 11,431,281 | B2 | 8/2022 | Perkins et al. |
| 11,444,569 | B2 | 9/2022 | Clemente et al. |
| 11,454,027 | B2 | 9/2022 | Kuiper et al. |
| 11,459,757 | B2 | 10/2022 | Nguyen et al. |
| 11,486,144 | B2 | 11/2022 | Bunea et al. |
| 11,489,482 | B2 | 11/2022 | Peterson et al. |
| 11,496,088 | B2 | 11/2022 | Sirski et al. |
| 11,508,861 | B1 | 11/2022 | Perkins et al. |
| 11,512,480 | B1 | 11/2022 | Achor et al. |
| 11,527,665 | B2 | 12/2022 | Boitnott |
| 11,545,927 | B2 | 1/2023 | Abra et al. |
| 11,545,928 | B2 | 1/2023 | Perkins et al. |
| 11,658,470 | B2 | 5/2023 | Nguyen et al. |
| 11,661,745 | B2 | 5/2023 | Bunea et al. |
| 11,689,149 | B2 | 6/2023 | Clemente et al. |
| 11,705,531 | B2 | 7/2023 | Sharenko et al. |
| 11,728,759 | B2 | 8/2023 | Nguyen et al. |
| 11,732,490 | B2 | 8/2023 | Achor et al. |
| 11,811,361 | B1 | 11/2023 | Farhangi et al. |
| 11,824,486 | B2 | 11/2023 | Nguyen et al. |
| 11,824,487 | B2 | 11/2023 | Nguyen et al. |
| 11,843,067 | B2 | 12/2023 | Nguyen et al. |
| 2002/0053360 | A1 | 5/2002 | Kinoshita et al. |
| 2002/0129849 | A1 | 9/2002 | Heckeroth |
| 2003/0101662 | A1 | 6/2003 | Ullman |
| 2003/0132265 | A1 | 7/2003 | Villela et al. |
| 2003/0217768 | A1 | 11/2003 | Guha |
| 2004/0000334 | A1 | 1/2004 | Ressler |
| 2005/0030187 | A1 | 2/2005 | Peress et al. |

(56) References Cited

U.S. PATENT DOCUMENTS

| | | |
|---|---|---|
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2005/0193673 A1 | 9/2005 | Rodrigues et al. |
| 2006/0042683 A1 | 3/2006 | Gangemi |
| 2006/0046084 A1 | 3/2006 | Yang et al. |
| 2007/0074757 A1 | 4/2007 | Mellott et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0289682 A1 | 11/2008 | Adriani et al. |
| 2008/0302030 A1 | 12/2008 | Stancel et al. |
| 2008/0315061 A1 | 12/2008 | Fath |
| 2009/0000222 A1 | 1/2009 | Kalkanoglu et al. |
| 2009/0014057 A1 | 1/2009 | Croft et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2009/0275247 A1 | 11/2009 | Richter et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0186798 A1 | 7/2010 | Tormen et al. |
| 2010/0242381 A1 | 9/2010 | Jenkins |
| 2010/0313499 A1 | 12/2010 | Gangemi |
| 2010/0325976 A1 | 12/2010 | DeGenfelder et al. |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2011/0314753 A1 | 12/2011 | Farmer et al. |
| 2012/0034799 A1 | 2/2012 | Hunt |
| 2012/0060434 A1 | 3/2012 | Jacobs |
| 2012/0060902 A1 | 3/2012 | Drake |
| 2012/0085392 A1 | 4/2012 | Albert et al. |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0282437 A1 | 11/2012 | Clark et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0118558 A1 | 5/2013 | Sherman |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0208675 A1 | 7/2014 | Beerer et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0294765 A1 | 10/2018 | Friedrich et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0083619 A1 | 3/2021 | Hegedus |
| 2021/0115223 A1 | 4/2021 | Bonekamp et al. |
| 2021/0159353 A1 | 5/2021 | Li et al. |
| 2021/0273126 A1* | 9/2021 | O'Neill .................. H10F 77/42 |
| 2021/0301536 A1 | 9/2021 | Baggs et al. |
| 2021/0343886 A1 | 11/2021 | Sharenko et al. |
| 2022/0060141 A1 | 2/2022 | Felton |
| 2022/0149213 A1 | 5/2022 | Mensink et al. |
| 2024/0186428 A1* | 6/2024 | Allert .................. H10F 77/315 |
| 2024/0291427 A1 | 8/2024 | Perkins et al. |

FOREIGN PATENT DOCUMENTS

| | | | | |
|---|---|---|---|---|
| CH | 700095 A2 | 6/2010 | | |
| CN | 202797032 U | 3/2013 | | |
| CN | 217150978 U | 8/2022 | | |
| CN | 116376452 A * | 7/2023 | ........... | H10F 19/804 |
| DE | 1958248 A1 | 11/1971 | | |
| EP | 1039361 A1 | 9/2000 | | |
| EP | 1837162 A1 | 9/2007 | | |
| EP | 1774372 A1 | 7/2011 | | |
| EP | 2446481 A2 | 5/2012 | | |
| EP | 2784241 A1 | 10/2014 | | |
| EP | 3772175 A1 | 2/2021 | | |
| JP | 10046767 A | 2/1998 | | |
| JP | 2002-106151 A | 4/2002 | | |
| JP | 2001-098703 A | 10/2002 | | |
| JP | 2017-027735 A | 2/2017 | | |
| JP | 2018053707 A | 4/2018 | | |
| KR | 20090084060 A | 8/2009 | | |
| KR | 10-1348283 B1 | 1/2014 | | |
| KR | 10-2019-0000367 A | 1/2019 | | |
| KR | 10-2253483 B1 | 5/2021 | | |

(56)     References Cited

FOREIGN PATENT DOCUMENTS

| NL | 2026856 B1 | 6/2022 |
| WO | 2010/151777 A2 | 12/2010 |
| WO | 2011/049944 A1 | 4/2011 |
| WO | 2015/133632 A1 | 9/2015 |
| WO | 2018/000589 A1 | 1/2018 |
| WO | 2019/201416 A1 | 10/2019 |
| WO | 2020-159358 A1 | 8/2020 |
| WO | 2021-247098 A1 | 12/2021 |

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.
RGS Energy, 3.5kW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

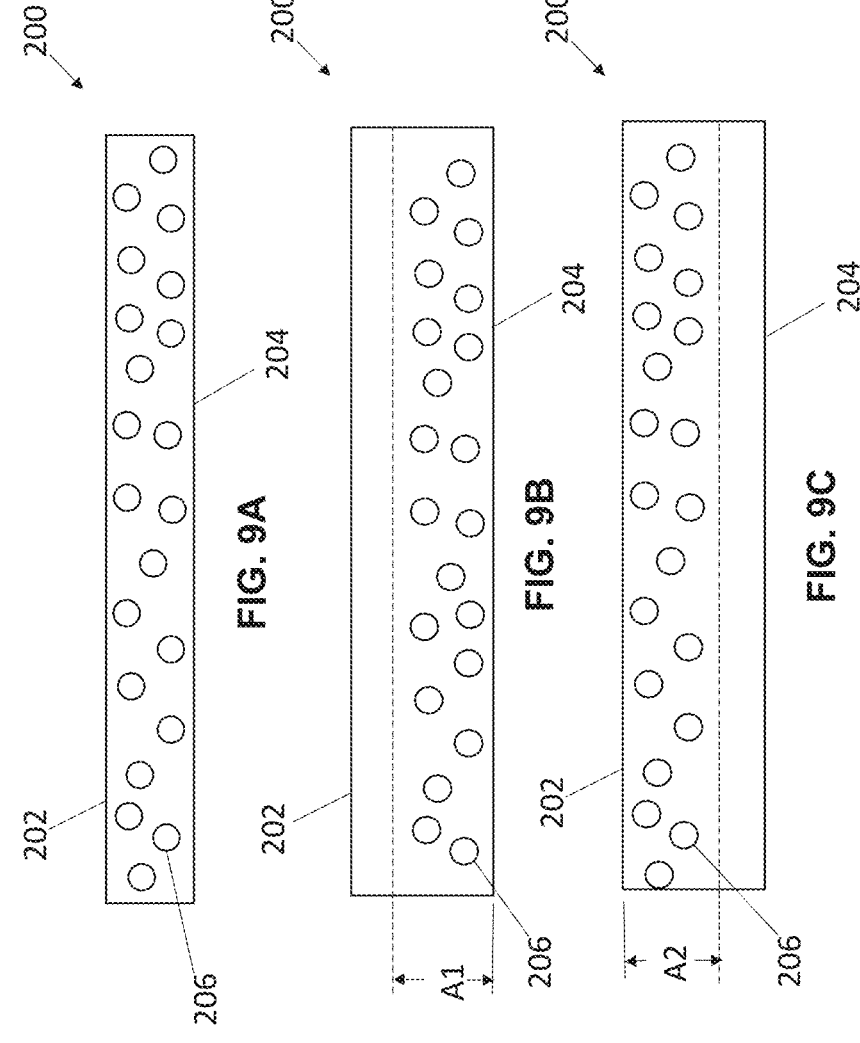

FRONTSHEETS FOR PHOTOVOLTAIC MODULES

CROSS-REFERENCE TO RELATED APPLICATION

This application is a Section 111(a) application relating to and claiming the benefit of commonly owned, U.S. Provisional Patent Application Ser. No. 63/643,002, filed May 6, 2024, entitled "PHOTOVOLTAIC MODULE AND ASSOCIATED ROOFING SYSTEM," the contents of which is incorporated herein by reference in its entirety.

FIELD

The present invention relates to a photovoltaic module and associated roofing system including the photovoltaic module, and, more specifically, to the roofing system including the photovoltaic module having a frontsheet.

BACKGROUND

In a known roofing system, a plurality of photovoltaic modules are installed on a sloped roof deck. A frontsheet is positioned above the solar cells of each of the photovoltaic modules.

SUMMARY

The Claims, rather than the Summary, define covered embodiments of the present invention. The Summary is a high-level overview of various aspects of the invention, and introduces some concepts that are further described in the Detailed Description below. The Summary is not intended to identify key or essential features of the claimed subject matter, and also is not intended to be used in isolation to determine the scope of the claimed subject matter. Instead, the claimed subject matter should be understood by reference to appropriate portions of the Specification and drawings, as well as to each claim.

In some embodiments, a roofing system a roof deck; and a plurality of photovoltaic modules installed on the roof deck, wherein each of the plurality of photovoltaic modules includes at least one solar cell, an encapsulant encapsulating the at least one solar cell, and a frontsheet, wherein the frontsheet is above the encapsulant, wherein the frontsheet comprises a first layer, and wherein the first layer comprises a plurality of cavities.

In some embodiments, wherein the plurality of cavities comprises at least one closed cavity. In some embodiments, wherein the plurality of cavities comprises at least one open cavity. In some embodiments, wherein each of the plurality of photovoltaic modules further comprises a filler material in at least one cavity of the plurality of cavities. In some embodiments, wherein the filler material comprises a fire-retardant material. In some embodiments, wherein the fire-retardant material comprises a liquid. In some embodiments, wherein the filler material comprises a phase-change material. In some embodiments, wherein the phase-change material comprises hydrated salts. In some embodiments, wherein the hydrated salts comprises calcium or sodium. In some embodiments, wherein the filler material comprises a gas. In some embodiments, wherein the gas comprises air. In some embodiments, wherein the gas comprises an inert gas. In some embodiments, wherein the plurality of cavities comprises at least two channels extending between opposite ends of the first layer. In some embodiments, wherein the at least two channels extend along a major dimension of the photovoltaic module.

In some embodiments, a roofing system including a roof deck; and a plurality of photovoltaic modules installed above the roof deck, wherein each of the plurality of photovoltaic modules includes at least one solar cell, an encapsulant encapsulating the at least one solar cell, and a frontsheet, wherein the frontsheet is above the encapsulant, wherein the frontsheet comprises a first layer, and wherein the first layer comprises a plurality of ribs, and wherein each of the ribs extend between opposite ends of the first layer.

In some embodiments, wherein the plurality of ribs comprises at least two ribs. In some embodiments, In some embodiments, wherein the plurality of ribs extends along a major dimension of the photovoltaic module. In some embodiments, a photovoltaic module including at least one solar cell; an encapsulant encapsulating the at least one solar cell; and a frontsheet, wherein the frontsheet is above the encapsulant, wherein the frontsheet comprises a first layer, and wherein the first layer comprises a plurality of cavities. In some embodiments, wherein the plurality of cavities comprises at least one closed cavity. In some embodiments, wherein the plurality of cavities comprises at least one open cavity.

BRIEF DESCRIPTION OF THE FIGURES

This section refers to the drawings that form a part of this disclosure, and which illustrate some of the embodiments of structure, materials, and/or methods of the present invention described herein.

FIGS. 9A through 9C are schematic, cross-sectional views of some embodiments of backsheets of photovoltaic modules.

DETAILED DESCRIPTION

Figure 1:
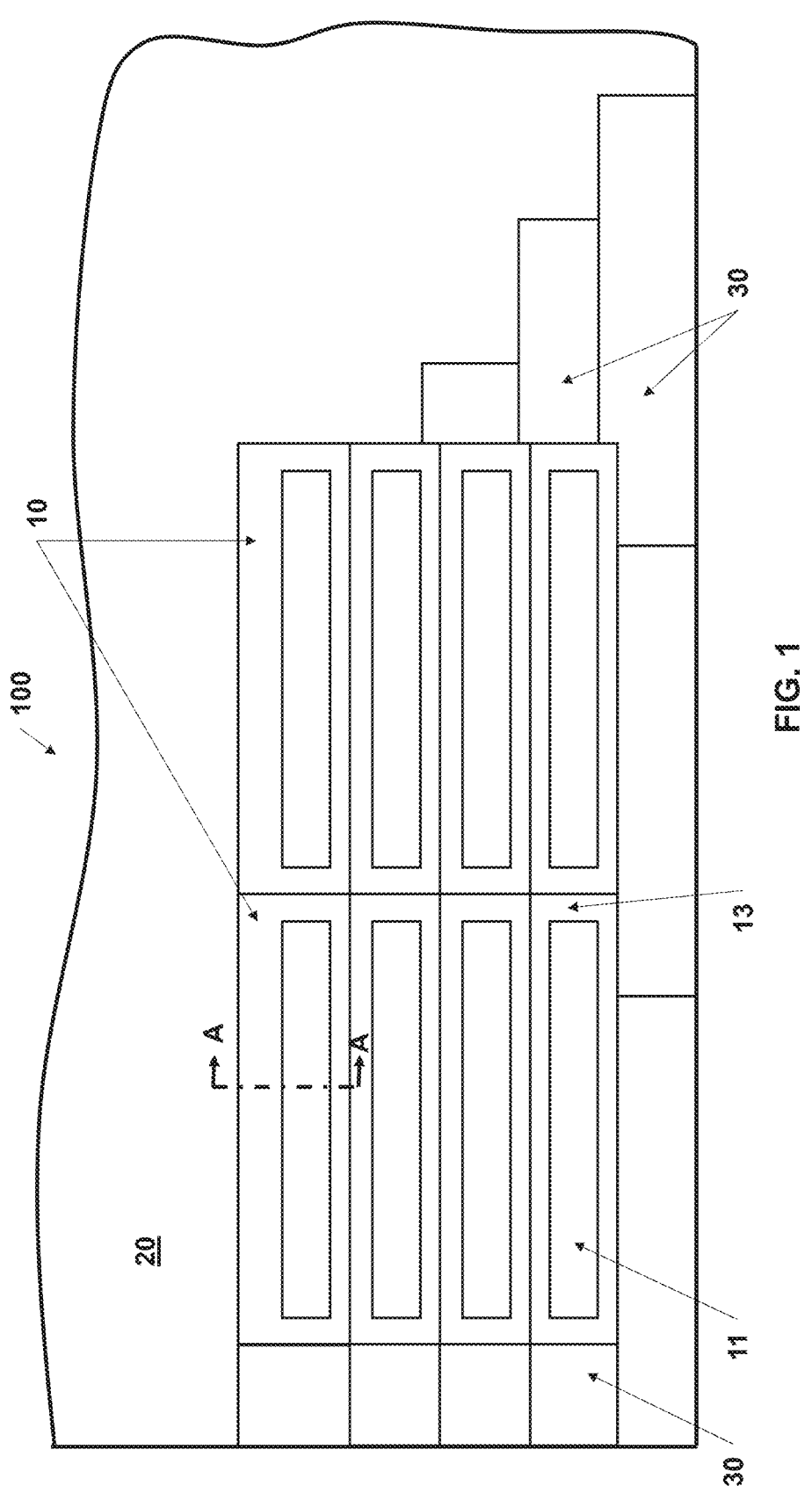
FIG. 1 is a schematic top view of a roofing system including a plurality of photovoltaic modules installed on a roof deck, in accordance with some embodiments of the invention.

In addition to the benefits and improvements that the Specification discloses, other objects and advantages that the Specification provides will become apparent from the following description taken in conjunction with the accompanying figures. Although the description discloses and describes detailed embodiments of the present disclosure, the disclosed embodiments are merely illustrative of the disclosure that may be embodied in various forms. In addition, each of the examples given regarding the various embodiments of the disclosure are intended to be illustrative, and not restrictive.

As used herein, a "steep slope" roof or roof deck is a roof or roof deck that has a pitch of Y/X, where Y and X are in a ratio of 4:12 to 20:12, where Y corresponds to the "rise" of the roof or roof deck, and where X corresponds to the "run" of the roof or roof deck.

As used herein, a "sloped" roof or roof deck is a roof or roof deck that has a pitch greater than zero (the roof or roof deck is not flat), but the pitch is less than that of a steep slope roof or roof deck.

In some embodiments, the present invention provides at least one photovoltaic module. In some embodiments, the present invention includes a plurality of photovoltaic modules. In some embodiments, the present invention provides a roofing system including at least one photovoltaic module installed on a roof deck. In some embodiments, the roofing system includes a plurality of photovoltaic modules installed on the roof deck. In some embodiments, the roofing system includes at least one roofing shingle installed on the roof deck with the one or more photovoltaic modules. In some embodiments, the roofing system includes a plurality of roofing shingles installed on the roof deck, with the one or more photovoltaic modules. In some embodiments, the roof deck is a sloped roof deck. In some embodiments, the sloped roof deck is a steep slope roof deck.

In some embodiments, the present invention provides one or more methods, including obtaining and/or installing of one or more photovoltaic modules, and/or obtaining and/or installing of one or more roofing shingles, on the roof deck.

In some embodiments, the roofing system and/or method includes an underlayment installed between the roof deck and the one or more roofing shingles and/or one or more photovoltaic modules. In some embodiments, the roofing system and/or method does not include an underlayment installed between the roof deck and the one or more roofing shingles and/or one or more photovoltaic modules, such that the one or more roofing shingles and/or one or more photovoltaic modules are installed directly on the roof deck.

In some embodiments, one or more of the photovoltaic modules includes a structure, composition, component, and/or function, except as otherwise described or shown herein, similar to those of one or more embodiments of the photovoltaic modules and photovoltaic shingles as disclosed, shown, and/or described in any or all of: U.S. application Ser. No. 17/831,307, filed Jun. 2, 2022, titled "Roofing Module System," and published under U.S. Patent Application Publication No. 2022-0393637 on Dec. 8, 2022; U.S. application Ser. No. 18/169,718, filed Feb. 15, 2023, titled "Roofing Module System," and published under U.S. Patent Application Publication No. 2023-0203815 on Jun. 29, 2023; PCT International Patent Publication No. WO 2022/051593, Application No. PCT/US2021/049017, published Mar. 10, 2022, titled "Building Integrated Photovoltaic System," owned by GAF Energy LLC; and/or U.S. Pat. No. 11,251,744 to Bunea et al., issued Feb. 15, 2022, titled "Photovoltaic Shingles and Methods of Installing Same"; and the disclosures of each of which are incorporated by reference herein in their entireties, with certain different and/or additional features as described herein.

In some embodiments, one or more of the roofing shingles includes a structure, composition, component, and/or function, except as otherwise shown and/or described herein, similar to those of one or more embodiments of a roofing shingle, a non-photovoltaic module, and/or a cuttable roofing shingle and/or non-photovoltaic module as disclosed, shown, and/or described in either or both of U.S. application Ser. No. 17/831,307, filed Jun. 2, 2022, titled "Roofing Module System," and published under U.S. Patent Application Publication No. 2022-0393637 on Dec. 8, 2022; and/or U.S. application Ser. No. 18/169,718, filed Feb. 15, 2023, titled "Roofing Module System," and published under U.S. Patent Application Publication No. 2023-0203815 on Jun. 29, 2023; and/or U.S. application Ser. No. 18/352,894, filed Jul. 14, 2023, titled "Solar Roofing System with Fiber Composite Roofing Shingles," and the disclosures of each of which are incorporated by reference herein in their entireties, with certain different and/or additional features as described herein.

In some embodiments, the photovoltaic module includes a frontsheet. In some embodiments, the frontsheet includes a single layer. In some embodiments, the frontsheet includes multiple layers. In some embodiments, the frontsheet includes two layers, including an upper layer (e.g., a layer that is the uppermost layer of the frontsheet and of the photovoltaic module when the photovoltaic module is installed on the roof deck, and a layer that is exposed to an external environment), and a lower layer (e.g., a layer that is the lowermost layer of the frontsheet when the photovoltaic module is installed on the roof deck). In some embodiments, the upper layer includes a polymer layer. In some embodiments, the lower layer includes a glass layer. In some embodiments, the frontsheet includes three layers, including an upper layer, a lower layer, and an intermediate layer between the upper layer and the lower layer. In some embodiments, the upper layer includes a polymer layer, the lower layer includes a glass layer, and the intermediate layer includes an adhesive layer. In some embodiments, the adhesive layer includes one or more of a thermosetting polyolefin, thermosetting polyolefin encapsulant material, thermosetting ethylene-vinyl acetate (EVA), EVA encapsulants, thermoplastic olefin, and/or thermoplastic polyolefin (TPO), and/or hybrids, and/or combinations thereof.

In some embodiments, the photovoltaic module includes at least one solar cell. In some embodiments, the at least one solar cell includes a plurality of solar cells. In some embodiments, the photovoltaic module includes the frontsheet above the one or more solar cells when the photovoltaic module is installed on the roof deck.

In some embodiments, the photovoltaic module includes an encapsulant encapsulating the at least one solar cell. In some embodiments, the photovoltaic module includes the frontsheet above the encapsulated solar cell. In some embodiments, the frontsheet is in contact with a surface of the encapsulant. In some embodiments, the encapsulant includes at least one of polyolefins, ethyl vinyl acetates, ionomers, silicones, poly vinyl butyral, epoxies, polyurethanes, and/or any hybrids thereof, and/or combinations thereof. In some embodiments, the encapsulant includes thermosetting polyolefin.

In some embodiments, the photovoltaic module includes a backsheet. In some embodiments, the backsheet is configured to be juxtaposed with the roof deck and/or the underlayment, when the photovoltaic module is installed on the roof deck. In some embodiments, the backsheet is in contact with the encapsulant. In some embodiments, the backsheet includes one or more layers. In some embodiments, the backsheet includes one layer. In some embodiments, the backsheet includes two layers, including an upper layer (e.g., a layer that is the uppermost layer of the backsheet when the photovoltaic module is installed on the roof deck), and a lower layer (e.g., a layer that is the lowermost layer of the backsheet when the photovoltaic module is installed on the roof deck, and which is closest to and/or in contact with the roof deck and/or the underlayment). In some embodiments, the backsheet includes three layers, including an upper layer, a lower layer, and an intermediate layer between the upper layer and the lower layer. In some embodiments, the backsheet includes four or more layers.

In some embodiments, the frontsheet includes at least one cavity (e.g., at least one cell within the frontsheet). In some embodiments, the frontsheet includes a plurality of cavities. In some embodiments, one or more (e.g., one, and/or more than one) of the cavities is within an interior of the frontsheet. In some embodiments, one or more of the cavities is entirely below an uppermost surface of the frontsheet, such that when the photovoltaic module is installed on the roof deck, there is material of the frontsheet between an uppermost portion of the cavity and the uppermost surface of the frontsheet. In some embodiments, one or more of the cavities is entirely above a lowermost surface of the frontsheet, such that when the photovoltaic module is installed on the roof deck, there is material of the frontsheet between a lowermost portion of the cavity and a lowermost surface of the frontsheet.

In some embodiments, the at least one cavity is within a top layer (e.g., a polymer layer) of a frontsheet that includes multiple (e.g., at least two) layers. In some embodiments, the plurality of cavities is within the top layer. In some embodiments, one or more of the cavities is within an interior of the top layer of the frontsheet. In some embodiments, one or more of the cavities is fully below a top surface of the top layer of the frontsheet, such that when the photovoltaic module is installed on the roof deck, there is material of the top layer of the frontsheet between an uppermost portion of the cavity and the top surface of the top layer. In some embodiments, one or more of the cavities is fully above a lowermost surface of the top layer of the frontsheet, such that when the photovoltaic module is installed on the roof deck, there is material of the top layer of the frontsheet between a lowermost portion of the cavity and a bottom surface of the top layer of the frontsheet.

In some embodiments, the at least one cavity is within a bottom layer (e.g. a glass layer) of a frontsheet that includes multiple (e.g., at least two) layers. In some embodiments, the plurality of cavities is within the bottom layer. In some embodiments, one or more of the cavities is within an interior of the bottom layer of the frontsheet. In some embodiments, one or more of the cavities is fully below a top surface of the bottom layer of the frontsheet, such that when the photovoltaic module is installed on the roof deck, there is material of the bottom layer of the frontsheet between an uppermost portion of the cavity and the top surface of the bottom layer. In some embodiments, one or more of the cavities is fully above a lowermost surface of the bottom layer of the frontsheet, such that when the photovoltaic module is installed on the roof deck, there is material of the bottom layer of the frontsheet between a lowermost portion of the cavity and a bottom surface of the bottom layer of the frontsheet.

In some embodiments, one or more of the cavities includes at least one closed cavity. In some embodiments, a closed cavity does not communicate with an external environment. In some embodiments, at least two of the cavities are in communication with one another, whether or not the cavities are otherwise closed and not in communication with the external environment. In some embodiments, some of the cavities are not in communication with one another. In some embodiments, none of the cavities are in communication with one another.

In some embodiments, one or more of the cavities includes at least one cavity open to an external environment. In some embodiments, one or more of the cavities is open to the external environment through one or more side surfaces of the frontsheet—for example, one or more of the cavities are open through one or more side surfaces extending between the uppermost or top surface of the frontsheet of the photovoltaic module and the lowermost or bottom surface of the frontsheet of the photovoltaic module, when the photovoltaic module is installed on the roof deck.

In some embodiments, one or more of the cavities have a rectangular cross-section. In some embodiments, one or more of the cavities have a square cross-section. In some embodiments, one or more of the cavities have a triangular cross-section. In some embodiments, one or more of the cavities have a polygonal cross-section. In some embodiments, one or more of the cavities have an elliptical cross-section. In some embodiments, one or more of the cavities have an oval cross-section. In some embodiments, one or more of the cavities have an arcuate cross-section. In some embodiments, two or more of the cavities have the same cross-section. In some embodiments, two or more of the cavities have different cross-sections. In some embodiments, all of the cavities have the same cross-section. In some embodiments, all of the cavities have different cross-sections.

In some embodiments, some or all of the cavities are aligned in a row. In some embodiments, some or all of the cavities are not aligned in a row. In some embodiments, some or all of the cavities are aligned in more than one row. In some embodiments, some or all of the cavities are aligned in two rows. In some embodiments, some or all of the cavities are aligned in three rows. In some embodiments, some or all of the cavities are aligned in four rows. In some embodiments, some or all of the cavities are aligned in more than four rows.

In some embodiments, some or all of the cavities are located equally (i.e., at an equal distance) between a top surface of the frontsheet (e.g., the uppermost surface when the photovoltaic module is installed on the roof deck) and a bottom surface of the frontsheet (e.g., the lowermost surface closest to the roof deck and/or underlayment). In some embodiments, some or all of the cavities are not located equally between the uppermost surface of the frontsheet and the lowermost surface of the frontsheet. In some embodiments, at least some of the cavities are located closer to the uppermost surface of the frontsheet than the lowermost surface of the frontsheet. In some embodiments, at least some of the cavities are located closer to the lowermost surface of the frontsheet than the uppermost surface of the frontsheet. In some embodiments, all of the cavities are located closer to the uppermost surface of the frontsheet than the lowermost surface of the frontsheet. In some embodiments, all of the cavities are located closer to the lowermost surface of the frontsheet than the uppermost surface of the frontsheet. In some embodiments, all of the cavities are located equally between the uppermost surface of the frontsheet and the lowermost surface of the frontsheet. In some embodiments, all of the cavities are not located equally between the uppermost surface of the frontsheet and the lowermost surface of the frontsheet.

In some embodiments, one or more of the cavities includes a filler material. In some embodiments, one of the cavities includes the filler material. In some embodiments, more than one of the cavities includes the filler material. In some embodiments, all of the cavities includes the filler material. In some embodiments, two or more of the cavities include a same filler material. In some embodiments, two or more cavities include different filler materials. In some embodiments, all of the cavities that include the filler material have the same filler material. In some embodiments, all of the cavities that include the filler material have a different filler material.

In some embodiments, the filler material includes a fire-retardant material. In some embodiments, the fire-retardant material includes one or more of siloxane oil, colemanite, aluminum trihydrate, magnesium hydroxide, expandable graphite, ammonium polyphosphate, triphenyl phosphate, resorcinol bis(diphenylphosphate), bisphenol A diphenyl phosphate, tricresyl phosphate, dimethyl methylphosphonate, aluminum diethyl phosphinate, decabromodiphenyl ether, decabromodiphenyl ethane, at least one brominated polystyrene, at least one brominated carbonate oligomer, at least one brominated epoxy oligomer, tetrabromophthalic anhydride, tetrabromobisphenol A, hexabromocyclododecane, antimony trioxide, antimony pentoxide, at least one chlorinated paraffin, huntite, hydromagnesite, red phosphorous, zinc borate, sodium borate, lithium borate, boric acid, tris(1,3-dichloro-2-propyl)phosphate, and/or tetrakis(2-chloroethyl)dichloroisopentyldiphosphate, and/or combinations thereof.

In some embodiments, the filler material includes a phase-change material. In some embodiments, the phase-change material modifies a thermal resistance of the frontsheet. In some embodiments, the phase-change material modifies the thermal resistance of the photovoltaic module. In some embodiments, the phase-change material includes a hydrated salt. In some embodiments, the phase-change material includes at least one of sodium disulfite pentahydrate, $NACH_3COO\cdot3H_2O$, $Mg(NO_3)_2\cdot6H_2O/Mg(NO_3)_2\cdot2H_2O$, propionamide/palmitic acid, camphene, myristic acid, sodium sulfite decahydrate, $Na_2HPO_4\cdot12H_2O$, $Zn(NO_3)_2\cdot6H_2O$, $Na_2SO_4\cdot10H_2O/NH_4Cl/KCl$, PE Glycol, $CaCl_2)/CaBr_2/6H_2O/KBr$, $CaCl_2)/CaBr_2/6H_2O$, $Na_2SO_4\cdot10H_2O/NaCl$, PE Glycol, $CaCl_2\cdot6H_2O$, $Na_2SO_4\cdot10H_2O$, $CaBr_2\cdot6H_2O$, Neopentyl glycol, $Na_2S_2O_3\cdot5H_2O$, Paraffin wax, $MgCl_2/Mg(NO_3)_2\cdot6H_2O$, $NaCO_2CH_3\cdot3H_2O$, $Na_4P_2O_7\cdot10H_2O$, $Mg(NO_3)_2\cdot6H_2O$, $MgCl_2\cdot6H_2O$, polyethylene, tetradecane, pentadecane, hexadecane (cetane), heptadecane, octadecane, nonadecane, eicosane, heneicosane, docosane, tricosane, tetracosane, pentacosane, hexacosane, heptacosane, octacosane, nonacosane, and/or triacontane, and/or combinations thereof.

In some embodiments, the filler material includes a gas. In some embodiments, the gas includes an inert gas. In some embodiments, the inert gas includes air, helium, neon, argon, krypton, xenon, radon, nitrogen, and/or carbon dioxide, and/or combinations thereof.

In some embodiments, the filler material is transparent. In some embodiments, the filler material is translucent. In some embodiments, the filler material is opaque. In some embodiments, the filler material includes a dye. In some embodiments, the filler material includes a pigment.

In some embodiments, the addition of the filler material to the cavity changes an optical property of the frontsheet. In some embodiments, the addition of the filler material changes a refractive index of the cavity and/or of the frontsheet. In some embodiments, the refractive index of the filler material is different than a refractive index of the frontsheet. In some embodiments, the refractive index of the filler material is 1. In some embodiments, the refractive index is greater than 1. In some embodiments, the refractive index is less than 1.

In some embodiments, one or more of the cavities is a channel. In some embodiments, the one or more channels extend between opposite ends of the frontsheet. In some embodiments, the one or more channels extend from one end to an opposite end of the frontsheet. In some embodiments, the one or more channels extend between ends of the frontsheet. In some embodiments, the one or more channels extend along a major dimension of the photovoltaic module (e.g., along a length of the photovoltaic module that extends parallel to the eave of the roof deck, when the photovoltaic module is installed on the roof deck). In some embodiments, the one or more channels extend along a minor dimension of the photovoltaic module (e.g., along a length of the photovoltaic module that extends parallel to the rake of the roof deck, when the photovoltaic module is installed on the roof deck).

In some embodiments, the frontsheet includes one or more ribs. In some embodiments, the one or more ribs are on the uppermost surface of the frontsheet when the photovoltaic module is installed on the roof deck. In some embodiments, the frontsheet includes a plurality of ribs. In some embodiments, the plurality of ribs includes at least two ribs. In some embodiments, the plurality of ribs includes two ribs. In some embodiments, the plurality of ribs includes three ribs. In some embodiments, the plurality of ribs includes four ribs. In some embodiments, the plurality of ribs includes five ribs. In some embodiments, the plurality of ribs includes six ribs. In some embodiments, the plurality of ribs includes seven ribs. In some embodiments, the plurality of ribs includes eight ribs. In some embodiments, the plurality of ribs includes more than eight ribs. In some embodiments, the ribs are about equally spaced on the top surface of the frontsheet. In some embodiments, the ribs are unequally spaced on the top surface of the frontsheet.

In some embodiments, a height of the rib is 5 mm. In some embodiments, the height of the rib is 10 mm. In some embodiments, the height of the rib is 15 mm. In some embodiments, the height of the rib is 20 mm. In some embodiments, the height is 5 mm to 20 mm. In some embodiments, the height is 10 mm to 20 mm. In some embodiments, the height is 5 mm to 15 mm. In some embodiments, one or more of the ribs has the same height as another one or more of the ribs. In some embodiments, one or more of the ribs has a different height than another one or more of the ribs.

In some embodiments, a width of the rib is 5 mm. In some embodiments, the width is 10 mm. In some embodiments, the width is 15 mm. In some embodiments, the width is 20 mm. In some embodiments, the width is 5 mm to 20 mm. In some embodiments, the width is 10 mm to 20 mm. In some embodiments, the width is 5 mm to 15 mm. In some embodiments, one or more of the ribs has the same width as another one or more of the ribs. In some embodiments, one or more of the ribs has a different width than another one or more of the ribs.

In some embodiments, a spacing between the ribs is 5 mm. In some embodiments, the spacing is 10 mm. In some embodiments, the spacing is 15 mm. In some embodiments, the spacing is 20 mm. In some embodiments, the spacing is 5 mm to 20 mm. In some embodiments, the spacing is 10 mm to 20 mm. In some embodiments, the spacing is 5 mm to 15 mm. In some embodiments, the spacing between two of the ribs is the same as the spacing between two of the ribs. In some embodiments, two of the ribs has a different spacing than a spacing between two of the ribs.

In some embodiments, one or more of the ribs extend along the major dimension of the photovoltaic module. In some embodiments, one or more of the ribs extend to ends of the frontsheet. In some embodiments, one or more of the ribs extend to locations spaced apart from ends of the frontsheet. In some embodiments, all of the ribs extends along the major dimension of the photovoltaic module. In some embodiments, none of the ribs extend along the major dimension of the photovoltaic module. In some embodiments, one or more of the ribs extends along a minor dimension of the photovoltaic module. In some embodiments, all of the ribs extends along the minor dimension of the photovoltaic module. In some embodiments, none of the ribs extend along the minor dimension of the photovoltaic module. In some embodiments, one or more of the ribs extend along the major dimension, and one or more of the ribs extend along the minor dimension. In some embodiments, one or more of the ribs extend in a different direction than the major dimension and/or the minor dimension. In some embodiments, all of the ribs extend in a different direction than the major dimension and/or the minor dimension. In some embodiments, none of the ribs extend in a different direction than the major dimension and/or the minor dimension.

Figures 2, 3, 4, 5:
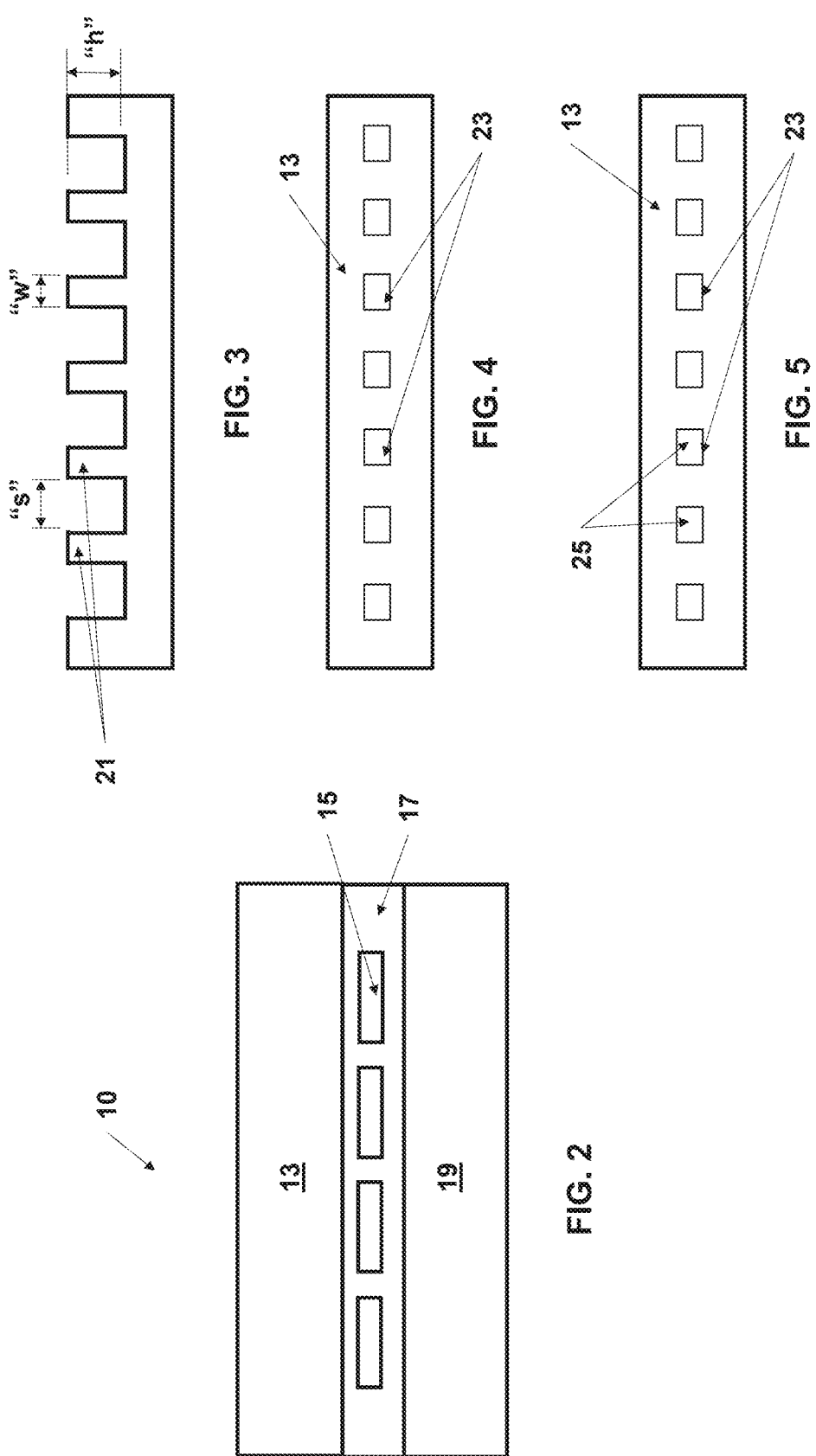
FIG. 2 is a schematic cross-sectional view of one of the photovoltaic modules taken along line A-A in FIG. 1, in accordance with some embodiments of the invention.
FIG. 3 is a schematic cross-sectional view of a frontsheet of one of the photovoltaic modules, taken along line A-A in FIG. 1, in accordance with some embodiments of the invention.
FIG. 4 is a schematic cross-sectional view of the frontsheet of one of the photovoltaic modules, taken along line A-A in FIG. 1, in accordance with some embodiments of the invention.
FIG. 5 is a schematic cross-sectional view of the frontsheet of one of the photovoltaic modules, taken along line A-A in FIG. 1, in accordance with some embodiments of the invention.

With reference to the drawings, FIG. 1 is a schematic top view of a roofing system 100 including a plurality of photovoltaic modules 10 installed on a roof deck 20, and FIG. 2 is a cross sectional view of one of the photovoltaic modules 10 taken along line A-A in FIG. 1, in accordance with some embodiments of the invention. As shown in FIGS. 1 and 2, in some embodiments, each of the photovoltaic modules 10 includes a frontsheet 13, at least one solar cell 15 that is encapsulated in (e.g., surrounded by) an encapsulant 17, and a backsheet 19. In some embodiments, the roofing system 100 includes a plurality of roofing materials 30, such as but not limited to roofing shingles, installed with the photovoltaic modules 10 on the roof deck 20. In some embodiments, the roof deck 20 is a sloped roof deck. In some embodiments, the sloped roof deck is a steep slope roof deck. In some embodiments, one or more of the roofing system 100, the photovoltaic module 10, the roof deck 20, and/or the roofing material 30 are in accordance with the above discussion.

Although FIGS. 1 and 2 show the photovoltaic module 10 including the frontsheet 13 that is a single layer, it is understood that when the frontsheet 13 includes multiple layers, the described cavities may be in any of the layers. Thus, for example, when the frontsheet 13 includes a top layer that is a polymer layer, a bottom layer that is a glass layer, and/or an intermediate layer that is an adhesive layer, the cavities may be formed in the any of all of the polymer layer, the adhesive layer, and/or the glass layer.

FIG. 3 is a schematic cross-sectional view of the frontsheet 13 of one of the photovoltaic modules 10, taken along line A-A in FIG. 1, in accordance with some embodiments of the invention. As the figure shows, in some embodiments, the frontsheet 13 includes a plurality of ribs 21. In some embodiments, the ribs 21 are in accordance with the above discussion. As the figure shows, in some embodiments, the ribs 21 having a height "h" and a width "w," and are spaced apart from one another by a spacing "s." In some embodiments, the height "h" may be in accordance with the above description of the rib height. In some embodiments, the width "w" may be in accordance with the above description of the rib width. In some embodiments, the spacing "s" may be in accordance with the above description of the rib spacing.

FIG. 4 is a schematic cross-sectional view of the frontsheet 13 of one of the photovoltaic modules 10, taken along line A-A in FIG. 1, in accordance with some embodiments of the invention. As the figure shows, in some embodiments, the frontsheet 13 includes a plurality of cavities 23 (e.g., open- and/or closed-cells). In some embodiments, the cavities 23 are in accordance with the above discussion. Although FIG. 4 shows the frontsheet 13 as a single layer, it is understood that when the frontsheet 13 includes multiple layers, the cavities 23 may be in any or all of the layers. Thus, for example, when the frontsheet 13 includes the top layer that is the polymer layer, the bottom layer that is the glass layer, and/or the intermediate layer that is the adhesive layer, the cavities 23 may be formed in one or more, two or more, or all three of the layers.

FIG. 5 is a schematic cross-sectional view of the frontsheet 13 of one of the photovoltaic modules 10, taken along line A-A in FIG. 1, in accordance with some embodiments of the invention. As the figure shows, in some embodiments, the frontsheet 13 includes a plurality of cavities 23 including a filler material 25. In some embodiments, the filler material 25 is in accordance with the above discussion. Although FIG. 5 shows the frontsheet 13 as a single layer, it is understood that when the frontsheet 13 includes multiple layers, the cavities 23 with the filler material 25 may be in and and/or any of the layers. Thus, for example, when the frontsheet 13 includes the top layer that is the polymer layer, the bottom layer that is the glass layer, and/or the intermediate layer that is the adhesive layer, the cavities 23 with or without the filler material 25 may be formed in either or both the polymer layer, the adhesive layer, and/or the glass layer.

Figures 6, 7, 8:
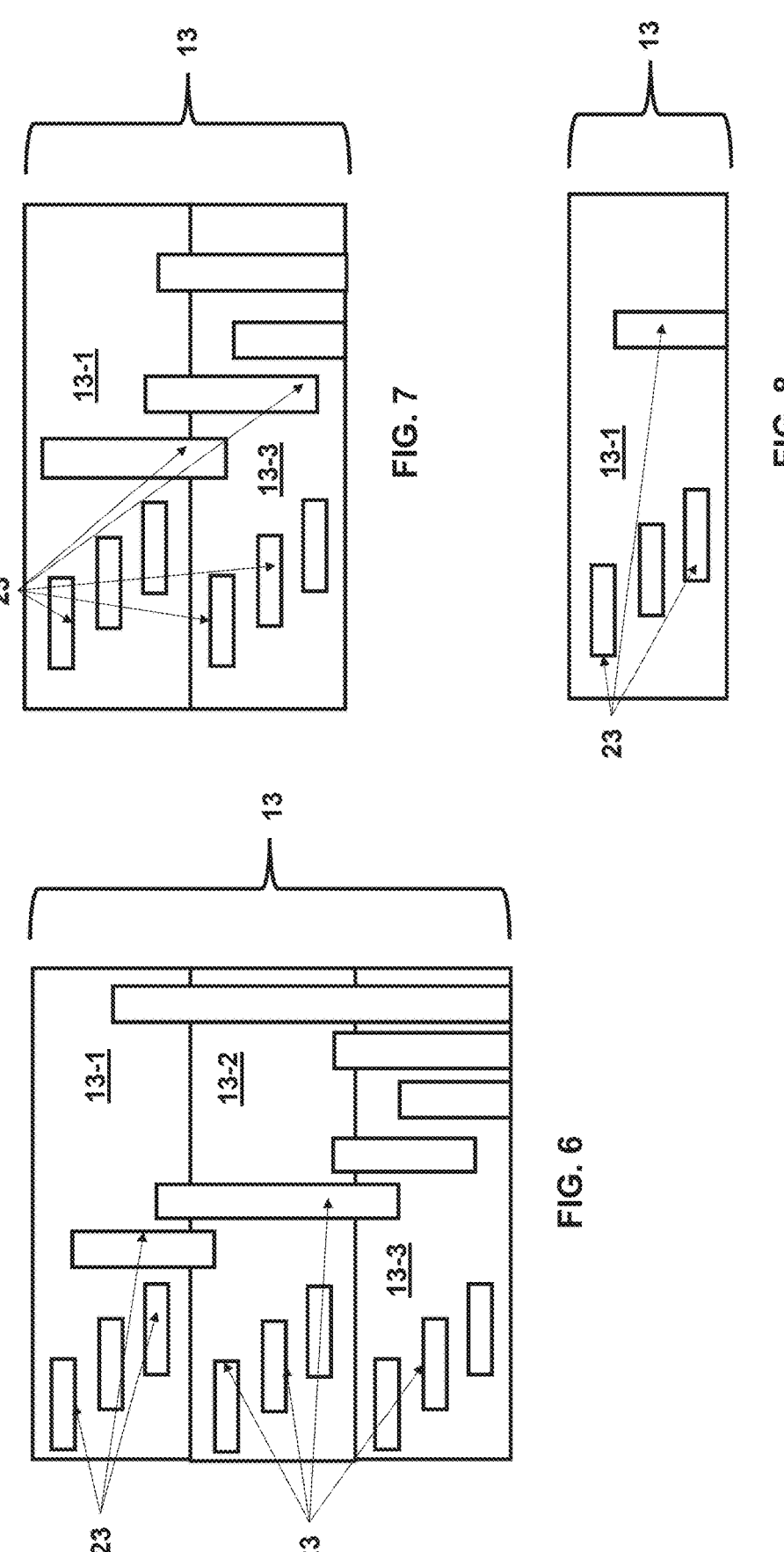
FIG. 6 is a schematic cross-sectional view of the frontsheet of one of the photovoltaic modules, taken along line A-A in FIG. 1, according to some embodiments of the invention.
FIG. 7 is a schematic cross-sectional view of the frontsheet of one of the photovoltaic modules, taken along line A-A in FIG. 1, according to some embodiments of the invention.
FIG. 8 is a schematic cross-sectional view of the frontsheet of one of the photovoltaic modules, taken along line A-A in FIG. 1, according to some embodiments of the invention.

FIGS. 6, 7, and 8 are schematic cross-sectional views of the frontsheet 13 of one of the photovoltaic modules, taken along line A-A in FIG. 1, according to some embodiments of the invention. FIG. 6 shows the frontsheet 13 including three layers, including a top layer 13-1 which may be but is not limited to a polymer layer, an intermediate layer 13-2 which may be but is not limited to an adhesive layer, and a bottom layer 13-3 which may be but is not limited to a glass layer, while FIG. 7 shows the frontsheet 13 including two layers, including the top layer 13-1 which may be but is not limited to the polymer layer, and the bottom layer 13-3 which may be but is not limited to the glass layer, and FIG. 8 shows the frontsheet 13 including the top layer 13-1, which may be but is not limited to a polymer layer. FIGS. 6, 7, and 8 show some examples of locations of cavities 23 within the frontsheet 13. It is understood that, in some embodiments, one or more of the cavities 23 may be in any particular location in the frontsheet 13, and/or one or more of the cavities 23 may be in different locations in the frontsheet 13. Further, in some embodiments, one or more of the cavities 23, or none of the cavities 23, may include the filler material 25. It is also understood that relative dimensions and/or shapes of the cavities 23 may differ from those shown in FIGS. 6-8, and/or that relative locations of the upper and/or lower ends of the cavities 23 may differ from what is shown in FIGS. 6-8.

Referring to FIGS. 9A through 9C, in some embodiments, a frontsheet 200 includes a first, upper surface 202, a second, lower surface 204 opposite the upper surface 202, and a plurality of pores 206 between the upper surface 202 and the lower surface 204. In some embodiments, at least some of the plurality of pores 206 are closed cell pores. In some embodiments, a substantial number of the plurality of pores 206 are closed cell pores. In some embodiments, all of the plurality of pores 206 are closed cell pores. In some embodiments, at least some of the plurality of pores 206 are open cell pores. In some embodiments, a substantial number of the plurality of pores 206 are open cell pores. In some embodiments, all of the plurality of pores 206 are open cell pores. In some embodiments, some of the plurality of pores 206 are open cell pores and some of the plurality of pores 206 are closed cell pores. In some embodiments, at least some of the plurality of pores 206 are open cell pores and a substantial number of the plurality of pores 206 are closed cell pores. In some embodiments, at least some of the plurality of pores 206 are closed cell pores and a substantial number of the plurality of pores 206 are open cell pores.

In some embodiments, as illustrated in FIG. 9A, an entirety or substantially the entirety of a volume of the frontsheet 200 is porous and includes the plurality of pores 206. In some embodiments, the plurality of pores 206 is dispersed and located substantially between the upper surface 202 and the lower surface 204 of the frontsheet 200. In some embodiments, the plurality of pores 206 is randomly dispersed and located between the upper surface 202 and the lower surface 204 of the frontsheet 200.

In some embodiments, as illustrated in FIG. 9B, the plurality of pores 206 is located proximate to the lower surface 204 of the frontsheet 200. In some embodiments, a substantial number of the plurality of pores 206 are located proximate to the lower surface 204 of the frontsheet 200. In some embodiments, a substantial number of the plurality of pores 206 are located proximate to the lower surface 204 of the frontsheet 200 within a volumetric area A1. In some embodiments, none of the plurality of pores 206 are located proximate to the upper surface 202 of the frontsheet 200. In some embodiments, a minimal number of the plurality of pores 206 are located proximate to the upper surface 202 of the frontsheet 200.

In some embodiments, as illustrated in FIG. 9C, the plurality of pores 206 is located proximate to the upper surface 202 of the frontsheet 200. In some embodiments, a substantial number of the plurality of pores 206 are located proximate to the upper surface 202 of the frontsheet 200. In some embodiments, a substantial number of the plurality of pores 206 are located proximate to the upper surface 202 of the frontsheet 200 within a volumetric area A2. In some embodiments, none of the plurality of pores 206 are located proximate to the lower surface 204 of the frontsheet 200. In some embodiments, a minimal number of the plurality of pores 206 are located proximate to the lower surface 204 of the frontsheet 200.

In some embodiments, the pore density of the frontsheet 200 is 0% to 75%, e.g., 0%, 10%, 20%, 30%, 40%, 50%, 60%, 70%, or 75%, including ranges between any of the foregoing values. In some embodiments, the pore density of the frontsheet 200 is 0% to 50%. In some embodiments, the pore density of the frontsheet 200 is 0% to 25%. In some embodiments, the pore density of the frontsheet 200 is 25% to 75%. In some embodiments, the pore density of the frontsheet 200 is 50% to 75%. In some embodiments, the pore density of the frontsheet 200 is 50% to 75%.

In some embodiments, the pore diameter of each, some or all of the plurality of pores 206 is 0.5 μm to 100 μm, e.g., 5 μm, 10 μm, 20 μm, 30 μm, 40 μm, 50 μm, 60 μm, 70 μm, 80 μm, 90 μm, or 100 μm, including ranges between any of the foregoing values. In some embodiments, the pore diameter of each, some or all of the plurality of pores 206 is 0.5 μm to 75 μm. In some embodiments, the pore diameter of each, some or all of the plurality of pores 206 is 0.5 μm to 50 μm. In some embodiments, the pore diameter of each, some or all of the plurality of pores 206 is 0.5 μm to 25 μm. In some embodiments, the pore diameter of each, some or all of the plurality of pores 206 is 0.5 μm to 15 μm. In some embodiments, the pore diameter of each, some or all of the plurality of pores 206 is 0.5 μm to 10 μm. In some embodiments, the pore diameter of each, some or all of the plurality of pores 206 is 0.5 μm to 5 μm. In some embodiments, the pore diameter of each, some or all of the plurality of pores 206 is 0.5 μm to 1 μm.

In some embodiments, the pore diameter of each, some or all of the plurality of pores 206 is 1 μm to 100 μm. In some embodiments, the pore diameter of each, some or all of the plurality of pores 206 is 1 μm to 75 μm. In some embodiments, the pore diameter of each, some or all of the plurality of pores 206 is 1 μm to 50 μm. In some embodiments, the pore diameter of each, some or all of the plurality of pores 206 is 1 μm to 25 μm. In some embodiments, the pore diameter of each, some or all of the plurality of pores 206 is 1 μm to 15 μm. In some embodiments, the pore diameter of each, some or all of the plurality of pores 206 is 1 μm to 10 μm. In some embodiments, the pore diameter of each, some or all of the plurality of pores 206 is 1 μm to 5 μm.

In some embodiments, the pore diameter of each, some or all of the plurality of pores 206 is 5 μm to 100 μm. In some embodiments, the pore diameter of each, some or all of the plurality of pores 206 is 5 μm to 75 μm. In some embodiments, the pore diameter of each, some or all of the plurality of pores 206 is 5 μm to 50 μm. In some embodiments, the pore diameter of each, some or all of the plurality of pores 206 is 5 μm to 25 μm. In some embodiments, the pore diameter of each, some or all of the plurality of pores 206 is 5 μm to 15 μm. In some embodiments, the pore diameter of each, some or all of the plurality of pores 206 is 5 μm to 10 μm.

In some embodiments, the pore diameter of each, some or all of the plurality of pores 206 is 10 μm to 100 μm. In some embodiments, the pore diameter of each, some or all of the plurality of pores 206 is 10 μm to 75 μm. In some embodiments, the pore diameter of each, some or all of the plurality of pores 206 is 10 μm to 50 μm. In some embodiments, the pore diameter of each, some or all of the plurality of pores 206 is 10 μm to 25 μm. In some embodiments, the pore diameter of each, some or all of the plurality of pores 206 is 10 μm to 15 μm.

In some embodiments, the pore diameter of each, some or all of the plurality of pores 206 is 15 μm to 100 μm. In some embodiments, the pore diameter of each, some or all of the plurality of pores 206 is 15 μm to 75 μm. In some embodiments, the pore diameter of each, some or all of the plurality of pores 206 is 15 μm to 50 μm. In some embodiments, the pore diameter of each, some or all of the plurality of pores 206 is 15 μm to 25 μm. In some embodiments, the pore diameter of each, some or all of the plurality of pores 206 is 25 μm to 100 μm. In some embodiments, the pore diameter of each, some or all of the plurality of pores 206 is 25 μm to 75 μm. In some embodiments, the pore diameter of each, some or all of the plurality of pores 206 is 25 μm to 50 μm. In some embodiments, the pore diameter of each, some or all of the plurality of pores 206 is 50 μm to 100 μm. In some embodiments, the pore diameter of each, some or all of the plurality of pores 206 is 50 μm to 75 μm. In some embodiments, the pore diameter of each, some or all of the plurality of pores 206 is 75 μm to 100 μm.

In some embodiments, the pore diameter of each, some or all of the plurality of pores 206 is 0.5 μm. In some embodiments, the pore diameter of each, some or all of the plurality of pores 206 is 1 μm. In some embodiments, the pore diameter of each, some or all of the plurality of pores 206 is 5 μm. In some embodiments, the pore diameter of each, some or all of the plurality of pores 206 is 10 μm. In some embodiments, the pore diameter of each, some or all of the plurality of pores 206 is 15 μm. In some embodiments, the pore diameter of each, some or all of the plurality of pores 206 is 25 μm. In some embodiments, the pore diameter of each, some or all of the plurality of pores 206 is 50 μm. In some embodiments, the pore diameter of each, some or all of the plurality of pores 206 is 75 μm. In some embodiments, the pore diameter of each, some or all of the plurality of pores 206 is 100 μm.

In some embodiments, the frontsheet 200 is composed of TPO. In some embodiments, the frontsheet 200 is composed of foamed TPO. In some embodiments, the frontsheet 200 includes at least one layer. In some embodiments, the frontsheet 200 includes a plurality of layers. In some embodiments, at least one layer of the frontsheet 200 is composed of foamed TPO. In some embodiments, more than one of the layers of the frontsheet 200 is composed of foam TPO.

In some embodiments, a roofing module includes at least one layer. In some embodiments, a roofing module includes a plurality of layers. In some embodiments, at least one of the layers of the roofing module includes one or more of the embodiments of the frontsheet 200 disclosed herein. In some embodiments, the roofing module is a roofing shingle. In some embodiments, the roofing shingle is not electrically active. In some embodiments, the roofing shingle does not include a solar cell. In some embodiments, the roofing module includes a structure, composition, component, and/ or function similar to those of one or more embodiments of roofing materials disclosed, shown, and/or described in either or both of U.S. application Ser. No. 17/831,307, filed Jun. 2, 2022, titled "Roofing Module System," and published under U.S. Patent Application Publication No. 2022-0393637 on Dec. 8, 2022; and/or U.S. application Ser. No. 18/169,718, filed Feb. 15, 2023, titled "Roofing Module System," and published under U.S. Patent Application Publication No. 2023-0203815 on Jun. 29, 2023; and/or U.S. application Ser. No. 18/352,894, filed Jul. 14, 2023, titled "Solar Roofing System with Fiber Composite Roofing Shingles," and published under U.S. Patent Application Publication No. 2024-0018781 on Jan. 18, 2024, owned by GAF Energy LLC; the disclosures of each of the foregoing are incorporated by reference herein in their entireties, with certain different and/or additional features of one or more of the embodiments of the frontsheet 200 disclosed herein.

Variations, modifications, and alterations to embodiments of the present disclosure described above will make themselves apparent to those skilled in the art. All such variations, modifications, alterations and the like are intended to fall within the spirit and scope of the present disclosure, limited solely by the appended claims.

While several embodiments of the present disclosure have been described, it is understood that these embodiments are illustrative only, and not restrictive, and that many modifications may become apparent to those of ordinary skill in the art. For example, all dimensions discussed herein are provided as examples only, and are intended to be illustrative and not restrictive.

Any feature or element that is positively identified in this description may also be specifically excluded as a feature or element of an embodiment of the present as defined in the claims.

The disclosure described herein may be practiced in the absence of any element or elements, limitation or limitations, which is not specifically disclosed herein. The terms and expressions which have been employed are used as terms of description and not of limitation, and there is no intention in the use of such terms and expressions of excluding any equivalents of the features shown and described or portions thereof, but it is recognized that various modifications are possible within the scope of the disclosure.

What is claimed is:

1. A roofing system, comprising:
   a roof deck; and
   a plurality of photovoltaic modules installed on the roof deck,
      wherein each of the plurality of photovoltaic modules includes
      at least one solar cell,
      an encapsulant encapsulating the at least one solar cell, and
      a frontsheet,
         wherein the frontsheet is above the encapsulant,
         wherein the frontsheet comprises a first layer, and
         wherein the first layer comprises a plurality of cavities, and
         a filler material in at least one cavity of the plurality of cavities,
            wherein the filler material comprises a fire-retardant material.

2. The roofing system of claim 1, wherein the plurality of cavities comprises at least one closed cavity.

3. The roofing system of claim 1, wherein the plurality of cavities comprises at least one open cavity.

4. The roofing system of claim 1, wherein the fire-retardant material comprises a liquid.

5. The roofing system of claim 1, wherein the plurality of cavities comprises at least two channels extending between opposite ends of the first layer.

6. The roofing system of claim 5, wherein the at least two channels extend along a major dimension of the photovoltaic module.

7. A photovoltaic module, comprising:
   at least one solar cell;
   an encapsulant encapsulating the at least one solar cell;
   a frontsheet,
      wherein the frontsheet is above the encapsulant,
      wherein the frontsheet comprises a first layer, and
      wherein the first layer comprises a plurality of cavities; and
   a filler material in at least one cavity of the plurality of cavities,
      wherein the filler material comprises a fire-retardant material or a phase change material.

8. The photovoltaic module of claim 7, wherein the plurality of cavities comprises at least one closed cavity.

9. The photovoltaic module of claim 7, wherein the plurality of cavities comprises at least one open cavity.

10. The photovoltaic module of claim 7, wherein the plurality of cavities comprises at least two channels extending between opposite ends of the first layer.

11. The photovoltaic module of claim 10, wherein the at least two channels extend along a major dimension of the photovoltaic module.

12. A roofing system, comprising:

a roof deck; and a plurality of photovoltaic modules installed on the roof deck, wherein each of the plurality of photovoltaic modules includes at least one solar cell, an encapsulant encapsulating the at least one solar cell, and a frontsheet, wherein the frontsheet is above the encapsulant, wherein the frontsheet comprises a first layer, and wherein the first layer comprises a plurality of cavities, and a filler material in at least one cavity of the plurality of cavities, wherein the filler material comprises a phase-change material.

13. The roofing system of claim 12, wherein the plurality of cavities comprises at least one closed cavity.

14. The roofing system of claim 12, wherein the plurality of cavities comprises at least one open cavity.

15. The roofing system of claim 12, wherein the plurality of cavities comprises at least two channels extending between opposite ends of the first layer.

16. The roofing system of claim 15, wherein the at least two channels extend along a major dimension of the photovoltaic module.

17. The roofing system of claim 12, wherein the phase-change material comprises hydrated salts.

18. The roofing system of claim 17, wherein the hydrated salts comprises calcium or sodium.

\* \* \* \* \*